US009231351B2

(12) United States Patent
Chung et al.

(10) Patent No.: US 9,231,351 B2
(45) Date of Patent: Jan. 5, 2016

(54) SMART PLUGS, SMART SOCKETS AND SMART ADAPTORS

(75) Inventors: Shen-Ming Chung, Chiayi County (TW); Hsiao-Hui Lee, Tainan (TW); Chin-Chen Lee, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 597 days.

(21) Appl. No.: 13/479,183

(22) Filed: May 23, 2012

(65) Prior Publication Data

US 2013/0164971 A1 Jun. 27, 2013

(30) Foreign Application Priority Data

Dec. 22, 2011 (TW) .................. TW100147901 A

(51) Int. Cl.
*H01R 3/00* (2006.01)
*H01R 13/66* (2006.01)
*H01R 31/06* (2006.01)
*G01R 19/25* (2006.01)

(52) U.S. Cl.
CPC .......... *H01R 13/665* (2013.01); *G01R 19/2513* (2013.01); *H01R 31/065* (2013.01)

(58) Field of Classification Search
CPC .. H01R 13/665; H01R 13/713; H01R 13/065; H01L 12/2803; G01R 19/2513
See application file for complete search history.

(56) References Cited

U.S. PATENT DOCUMENTS

| | | | | |
|---|---|---|---|---|
| 4,387,388 A * | 6/1983 | Zakhariya | ..................... | 257/697 |
| 5,297,015 A * | 3/1994 | Miyazaki et al. | ............. | 363/146 |
| 7,657,763 B2 * | 2/2010 | Nelson et al. | .................. | 713/300 |
| 2002/0169914 A1 * | 11/2002 | Shteyn | ........................... | 710/305 |
| 2008/0024008 A1 * | 1/2008 | Chiu et al. | ....................... | 307/23 |
| 2009/0192927 A1 * | 7/2009 | Berg et al. | ........................ | 705/34 |
| 2009/0263999 A1 * | 10/2009 | Onoue | .................. | H01R 13/713 |
| | | | | 439/215 |
| 2010/0280674 A1 | 11/2010 | Jalili | | |
| 2011/0159723 A1 * | 6/2011 | Fukushima | ........ | H01R 13/6683 |
| | | | | 439/488 |
| 2011/0256767 A1 * | 10/2011 | Malstrom et al. | ......... | 439/620.01 |
| 2012/0045926 A1 * | 2/2012 | Lee | ..................... | H01R 13/6691 |
| | | | | 439/488 |
| 2013/0164971 A1 * | 6/2013 | Chung et al. | .................. | 439/489 |

FOREIGN PATENT DOCUMENTS

| | | |
|---|---|---|
| CN | 2713683 | 7/2005 |
| CN | 2713684 | 7/2005 |
| CN | 2738432 | 11/2005 |
| CN | 101515693 | 8/2009 |

(Continued)

OTHER PUBLICATIONS

In-Ho Choi et al., "Implementation and Evaluation of the Apparatus for Intelligent Energy Management to Apply to the Smart Grid at Home," Instrumentation and Measurement Technology Conference, May 2011, pp. 1-5, IEEE, US.

(Continued)

*Primary Examiner* — Fekadeselassie Girma
*Assistant Examiner* — Yong Hang Jiang

(57) ABSTRACT

A smart socket is provided. The smart socket has a set of power sockets, configured for a set of power pins of a smart plug to plug into, a driving pin and a set of detection pins, configured for forming a circuit with a set of feedback pins of a smart plug when the set of power pins is plugged into the power sockets, and an identification code module, configured for obtaining an identification code of an electric appliance, from the circuit, to which the smart plug belongs.

15 Claims, 11 Drawing Sheets

(56) References Cited

FOREIGN PATENT DOCUMENTS

| CN | 101542343 | 9/2009 |
|---|---|---|
| JP | H03-53475 | 3/1991 |
| JP | 03-149780 | 6/1991 |
| JP | 2000-122730 | 4/2000 |
| JP | 2010-198817 | 9/2010 |
| TW | 515598 | 12/2002 |
| TW | M255559 | 1/2005 |
| TW | M258472 | 3/2005 |
| TW | M291114 | 5/2006 |
| TW | 335850 | 7/2008 |
| TW | 370865 | 12/2009 |
| TW | 201112531 | 4/2011 |
| TW | M418472 | 12/2011 |

OTHER PUBLICATIONS

Kittiphan Techakittiroj, "Electrical Plug and Outlet for the DC Distribution System in Buildings," Internaitonal Conference on Control, Automation and Systems, Oct. 2008, pp. 2667-2670, IEEE, Korea.

Yu Rulong et al., "Intelligent Control of Power Plug," The Eighth International Conference on Electronic Measurement and Instruments, Jul. 2007, pp. 1-61-1-64, IEEE, China.

In-Ho Choi et al., "Development of Smart Controller with Demand Response for AMI Connection," Internaitonal Conference on Control, Automation and Systems, Oct. 2010, pp. 752-755, IEEE, Korea.

Taiwan Patent Office, Office Action, Patent Application Serial No. 100147901, Oct. 18, 2013, Taiwan.

* cited by examiner

SMART PLUGS, SMART SOCKETS AND SMART ADAPTORS

CROSS REFERENCE TO RELATED APPLICATIONS

This Non-provisional application claims priority under 35 U.S.C. §119(a) on Patent Application No(s). 100,147,901, filed in Taiwan, Republic of China on Dec. 22, 2011, the entire contents of which are hereby incorporated by reference.

TECHNICAL FIELD

The present disclosure is related to smart power monitoring technology.

BACKGROUND

Electric meters are popularly used in houses, offices, industrial plants, or specific places for monitoring overall power consumption thereof.

To precisely measure the power consumption, the electric meters can be disposed on each electric appliance. However, this manner costs a lot and is impracticable. Sometimes, a compromise power consumption measurement method is used, where the electric meters are only disposed on a power socket for measuring electric appliances that are provided power by the power socket. Predictably, this manner fails to precisely measure the operation or standby power consumption of each of the electric appliances.

Therefore, an apparatus which helps to identify various electric appliances and to monitor the power consumption of electric appliances will be for establishment of a smart power grid.

SUMMARY

The present disclosure provides a smart socket. The smart socket comprises a set of power sockets, configured for a set of power pins of a smart plug to plug into; a driving pin and a set of detection pins, configured for forming a circuit with a set of feedback pins of a smart plug when the set of power pins is plugged into the power sockets; and an identification code module, configured for obtaining an identification code of an electric appliance, from the circuit, to which the smart plug belongs.

The present disclosure also provides a smart plug. The smart plug comprises a set of power pins, for plugging into a set of power sockets of a smart socket; and a set of feedback pins, configured for forming a circuit with a driving pin and a set of detection pins of a smart socket when the set of power pins and the set of power sockets are connected to each other.

The present disclosure also provides a smart adaptor. The smart adaptor comprises a set of adapting pins, configured for a set of power pins of a normal plugs to plug into, and for adapting the set of power pins to a set of power sockets of a smart socket; and a set of feedback pins, configured for forming a circuit with a driving pin and a set of detection pins of the smart socket when the power pins and the power sockets are connected to each other.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 2D shows the transmission circuit and identification code circuit of the present invention.

FIG. 2E shows the transmission circuit and identification code circuit of the present invention.

DETAILED DESCRIPTION

The following description is the best-contemplated mode of carrying out the disclosure. This description is made for the purpose of illustrating the general principles of the disclosure and should not be taken in a limiting sense. The scope of the disclosure is best determined by reference to the appended claims.

Smart Plugs And Socket

Embodiment I

The present disclosure provides smart plugs and smart sockets. The smart plugs and sockets of the present disclosure can be connected to each other to form a particular circuit for detecting an identification code (ID) of an electric appliance. The terms "smart plugs" and "smart sockets" are used hereinafter to distinguish the "smart plugs" and "smart sockets" from the "normal plugs" and "normal sockets". The "smart plugs/socket" and the "normal plugs/socket" may be the same in appearance but different in structure. The smart plugs and socket of the present disclosure will be described in detail in the following embodiments in accordance with FIGS. 1-5. For illustration, the smart plugs/sockets shown in FIGS. 1-5 are in NEMA 1-15 A style or B style, but the smart plugs/sockets of the present disclosure should not be limited to any particular appearance or style.

Figure 1A:
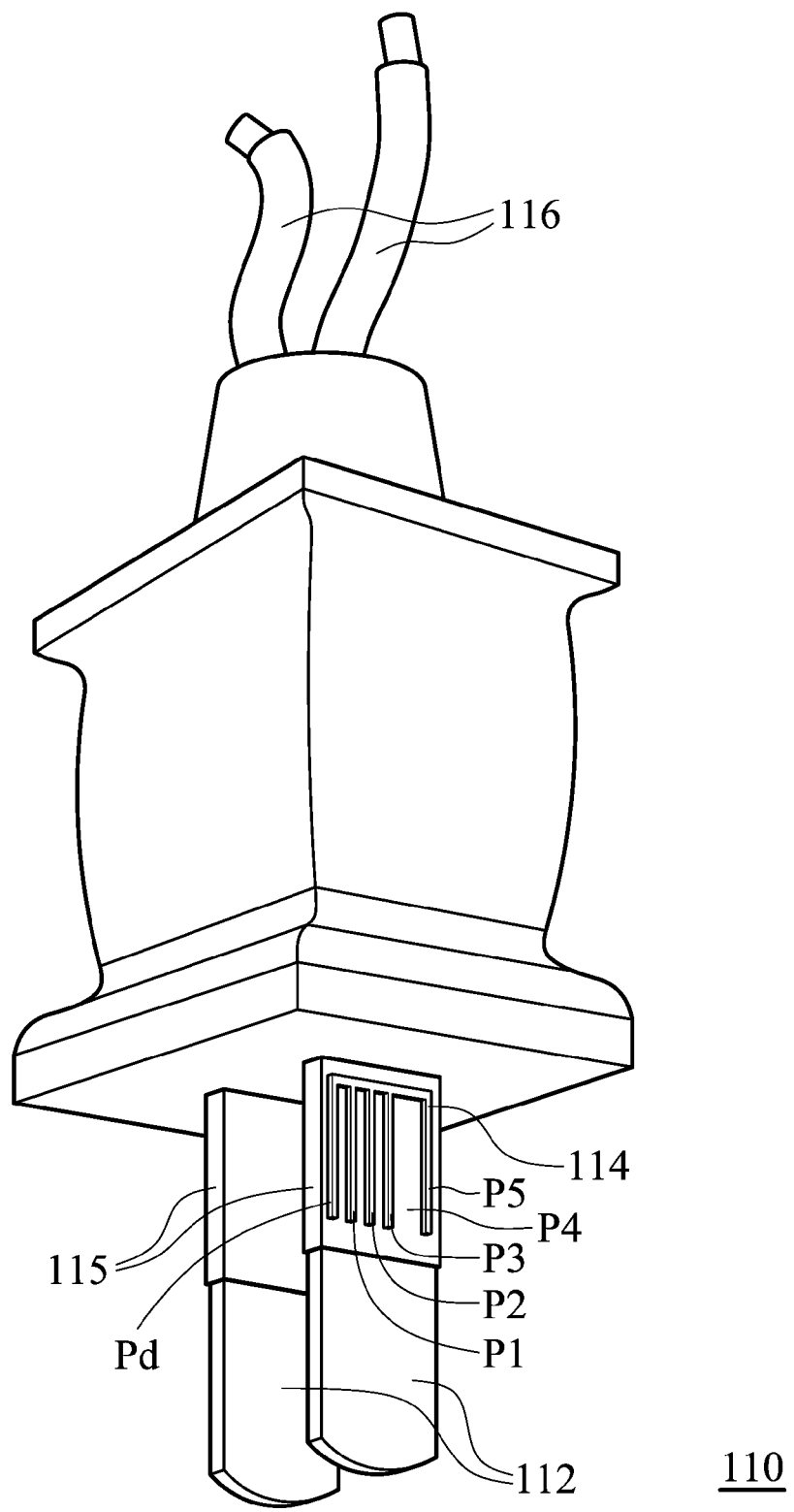
FIG. 1A is a pictorial drawing of a smart plug according to an embodiment of the present disclosure.
Figure 1B:
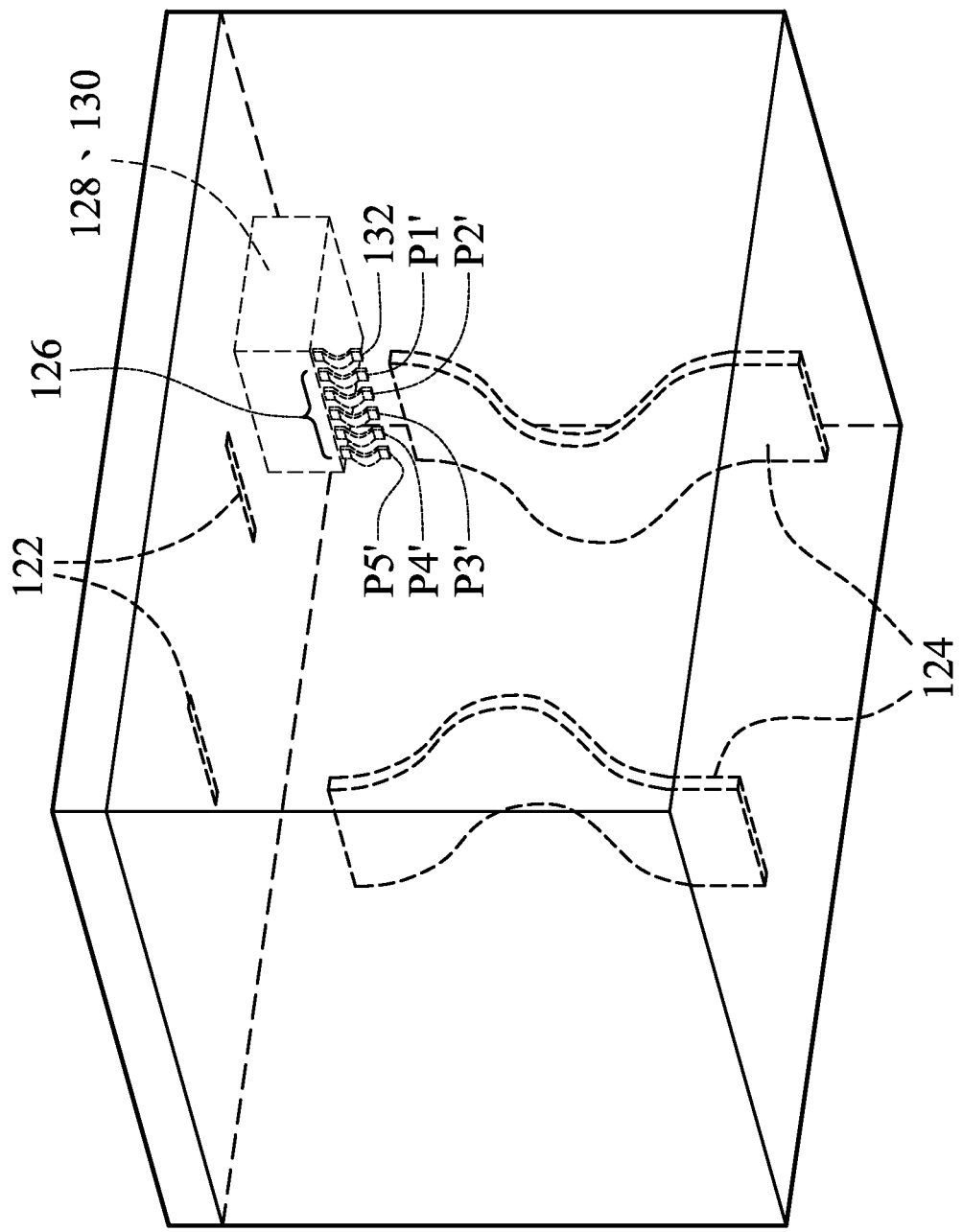
FIG. 1B is a pictorial drawing of a smart socket which matches the smart plugs in FIG. 1A.
Figure 1C:
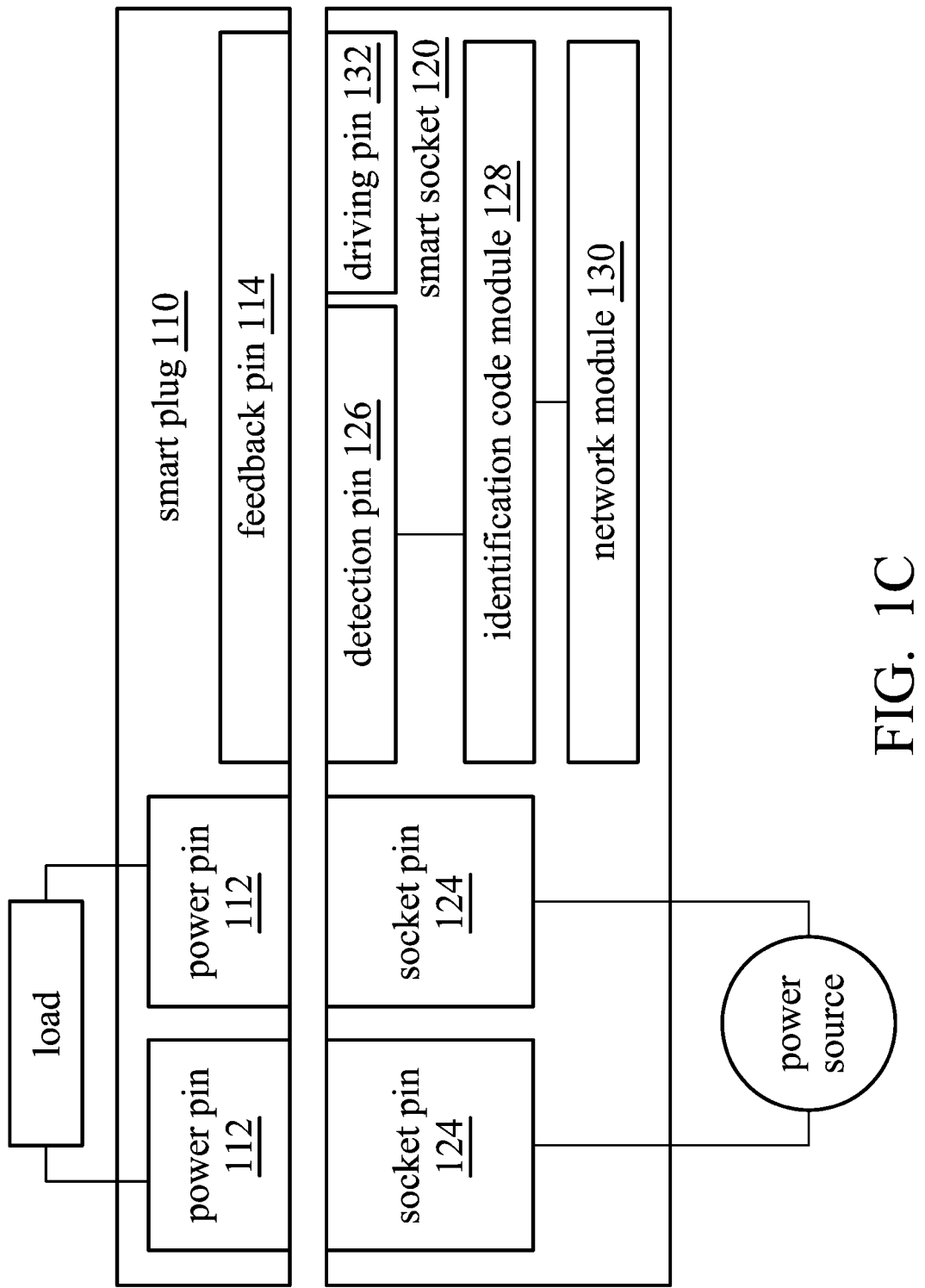
FIG. 1C shows the connection between the smart plug in FIG. 1A and the smart socket in FIG. 1B.

FIG. 1A is a pictorial drawing of a smart plug according to an embodiment of the present disclosure, FIG. 1B is a pictorial drawing of a smart socket which matches the smart plugs in FIG. 1A, and FIG. 1C shows the connection between the smart plug in FIG. 1A and the smart socket in FIG. 1B. As shown FIG. 1A, the smart plug 110 is connected to an electric appliance (not shown) via a wire 116. The smart plug 110 not only has a set of power pins 112 which is similar to those in a normal plug, but also a set of feedback pins 114. It can be found in FIG. 1B that the smart socket 120 which matches the smart plug 110 not only has a set of power sockets 122 and a set of socket pins 124 which are similar to those in a normal socket, but also a set of detection pins 126, a driving pin 132, an identification code module 128, and a network module 130. The socket pins 124 are connected to a power source (which is usually provided by a power company in alternating current, but the present disclosure should not be limited thereto). When the power pins 112 of the smart plug 110 plugs into the power sockets 122, the power pins 112 are connected to the socket pins 124 and further electrically connected to the power source. It should be noted that when the power pins 112 are plugged into the power sockets 122, at least one of the detection pins 126 and the driving pin 132 of the smart socket 120 will contact with the feedback pins 114 of the smart plug 110 to form a circuit. Then, the identification code module 128 in the smart socket 120 can use the identification code obtained from the circuit to know what the electric appliance of the smart plug 110 is, and output the identification code to the outside via the network module 130.

To make sure that the circuit works normally, the feedback pins 114 should be properly insulated from the power pins 112. Therefore, as shown in FIG. 1A, the feedback pins 114 are disposed on an insulation layer 115, which has a proper thickness and cover part of the power pins 112 that the socket pins 124 do not contact. Similarly, as shown in FIG. 1B, the detection pins 126 and the driving pin 132 should be insulated from the socket pins 124 and the power pins 112. In an embodiment, the identification code module 128 and the network module 130 of the smart socket 120 are disposed in an insulated envelope. However, it should be noted that the pins in the present disclosure should not be limited to being disposed at any particular place as long as the feedback pins 114 of the smart plug 110 can contact with at least one of the detection pins 126 and a driving pin 132 of the smart socket 120 to form the said circuit for identifying the electric appliance.

The principle that the identification code module 128 of the present disclosure generates an identification code will be discussed here in accordance with FIGS. 1A, 1B and 1C. As shown in FIGS. 1A and 1B, the set of feedback pins 114 in the smart plug 110 is composed of a plurality of metal pins P5~P1 and Pd (in this embodiment, pin P4 is removed for forming an exemplary identification code), and in the smart socket 120, the detection pins 126, which comprises P5'~P1' in this embodiment, and the driving pin 132 are respectively used to contact the said pins P5~P1 and Pd. As the smart plug 110 is plugged into the smart socket 120 and contacts the socket pins 124, a detection signal sent from the identification code module 128 of the smart socket 120 can be delivered to the feedback pins of the smart plug 110 via the driving pin 132, and then the identification code module 128 obtains a set of feedback signals from the circuit which is composed of the driving pins 132, the feedback pins 114 and the detection pins 126. In this embodiment, since each of the existing pins P5 and P3~P1 feedback the detection signal and may be regarded as a digit "1", while the removed pin P4 (nonexistent for exemplary purpose) results no feedback signal and may be regarded as a digit "0", the detection pins 126 may obtain the feedback signal in pattern of digits "10111" corresponding to the detected signals on P5', P4', P3', P2' and P1' respectively. This pattern can be deemed as the identification code of the electric appliance which corresponds to the feedback pins 114 in this embodiment.

From the five pairs of the corresponding pins (where pins P5~P1 respectively correspond to pin P5'~P1'), the combination of feedback pins 114 can at most stand for 32 ($2^5$) electric appliances. In an embodiment, the identification code with all null value "00000" can be used to stand for "something not an electric appliance." In an embodiment, the identification code is used to determine whether to turn on or turn off a safety switch which controls the connection between the socket pins and the power source. For example, when a null identification code is identified, the safety switch is turned off by the smart socket 120 for avoiding electrical hazard. Note that the five pairs of the pins in these embodiments are shown for illustration, and the number and the physical location of the pins in the present disclosure should not be limited thereto.

The smart plug 110 in the above embodiments does not "actively" send the detection signal. The following introduces another embodiment of the present disclosure where the smart plug 110 "actively" sends an identification code.

Smart Plugs And Socket

Embodiment II

Figure 2A:
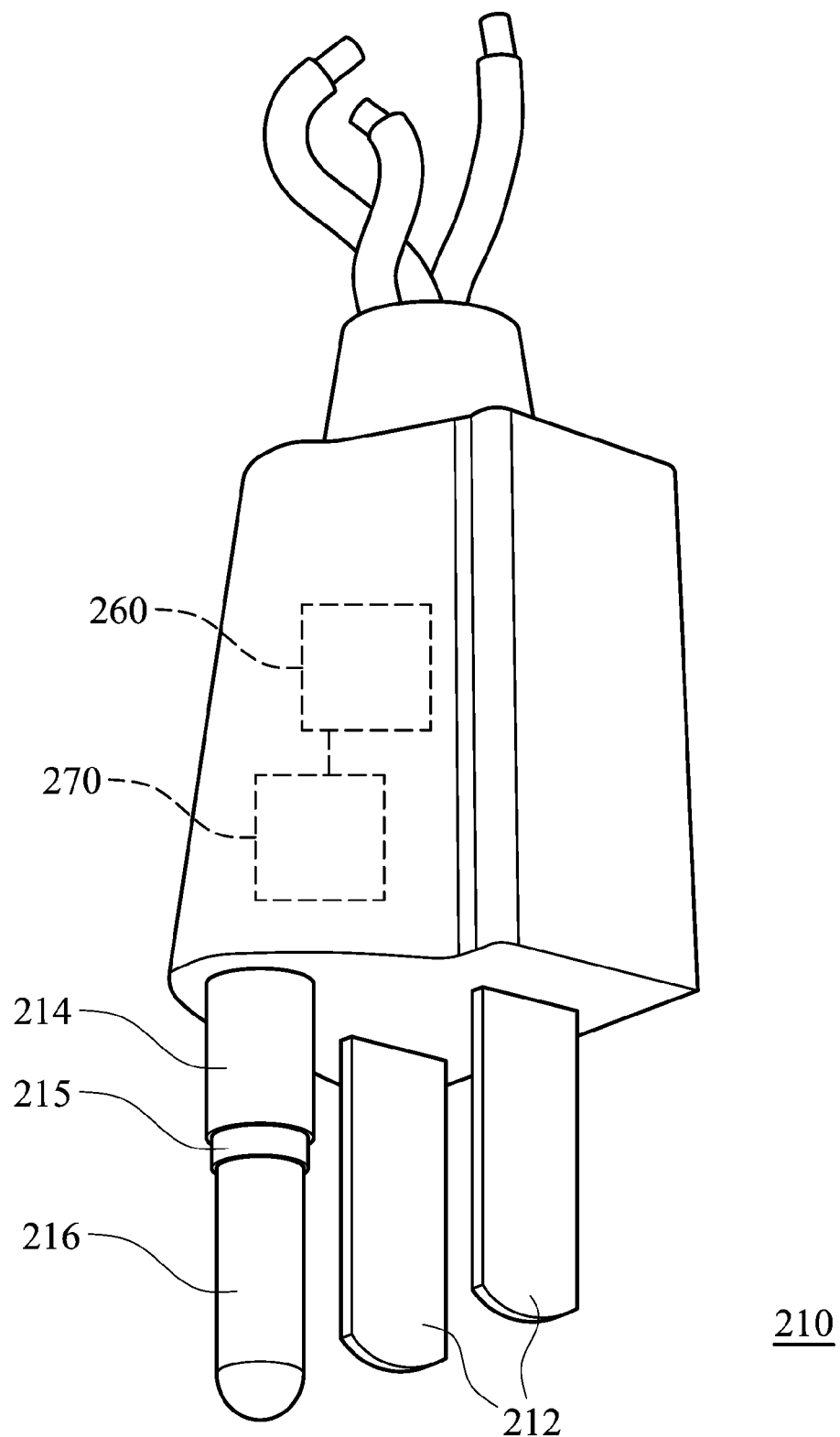
FIG. 2A is a pictorial drawing of a smart plug (NEMA 1-15 B style) according to another embodiment of the present disclosure.
Figure 2B:
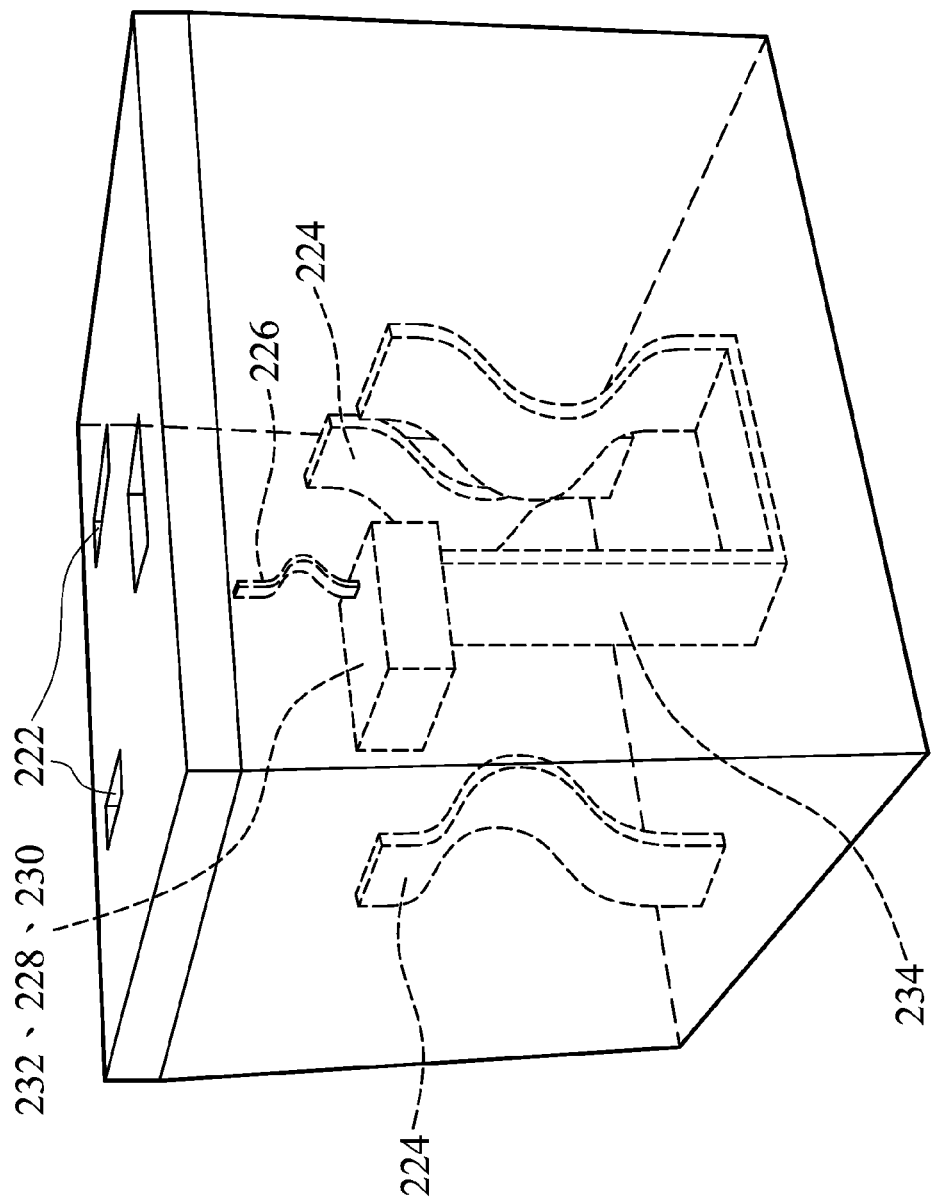
FIG. 2B is a pictorial drawing of a smart socket which matches the smart plugs in FIG. 2A.
Figure 2C:
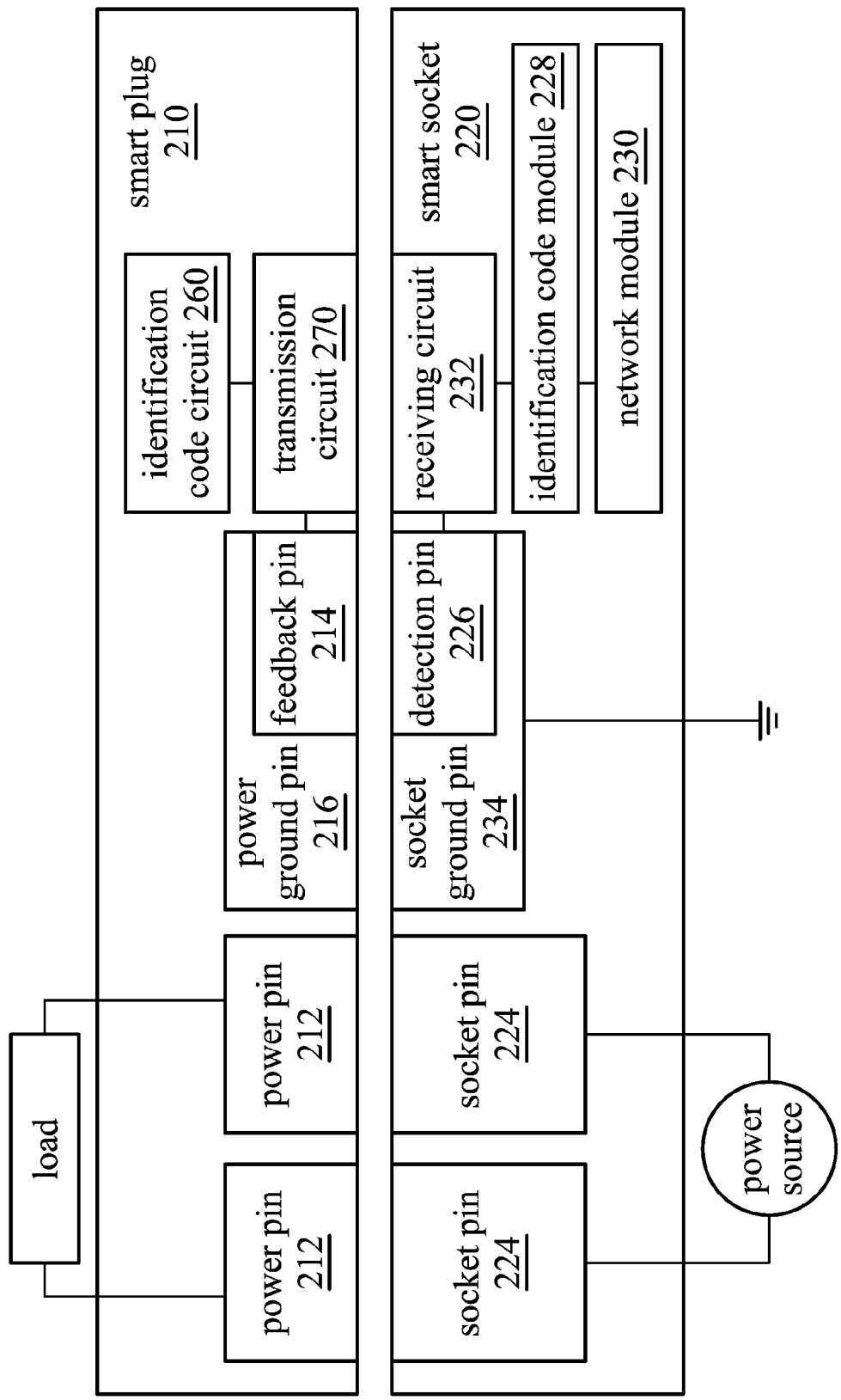
FIGS. 2C, 2D and 2E show the connection between the smart plug in FIG. 2A and the smart socket in FIG. 2B.

FIG. 2A is a pictorial drawing of a smart plug (NEMA 1-15 B style) according to another embodiment of the present disclosure, FIG. 2B is a pictorial drawing of a smart socket which matches the smart plugs in FIG. 2A, and FIG. 2C shows the connection between the smart plug in FIG. 2A and the smart socket in FIG. 2B. In this embodiment, the smart plugs 210 comprises a set of power pins 212, a power ground pin 216 (in column shape) and a set of feedback pins 214, where the set of feedback pins 214 is simply a metal layer which is insulated from the power ground pin 216 by an insulation layer 215. Similarly, in this embodiment, the smart socket 220 has a set of power sockets 222, a set of socket pins 224, a socket pins 234, a set of detection pins 226, a receiving circuit 232, an identification code module 228 and a network module 230. When the power pins 212 of the smart plug 210 plug into the power sockets 222, the power pins 212 contacts the socket pins 224 and thus obtain electricity from the power source. When the power ground pin 216 and the feedback pins 214 are respectively connected to the socket ground pins 234 and the detection pins 226 of the smart socket 220 to form a particular circuit, the transmission circuit 270 in the smart plug 210 can further transmit a 48-bits identification code, an 8-bits group code and an 8-bit CRC certification code, which are generated by the identification code circuit 260, to the receiving circuit 232 of the smart socket 220. Then, the identification code module 228 checks the said codes, and the network module outputs the identification code.

To make sure that the circuit works normally, the feedback pin 214 has to be insulated from the power ground pin 216. As such, there is an insulation layer 215 disposed between the power ground pin 216 and the feedback pin 214 for separating the power ground pin 216 from the feedback pin 214, which makes sure that the socket ground pin 234 and the detection pins 226 of the smart socket 220 will be respectively connected to the power ground pin 216 and feedback pin 214 of the smart plug 210.

Figure 2D:
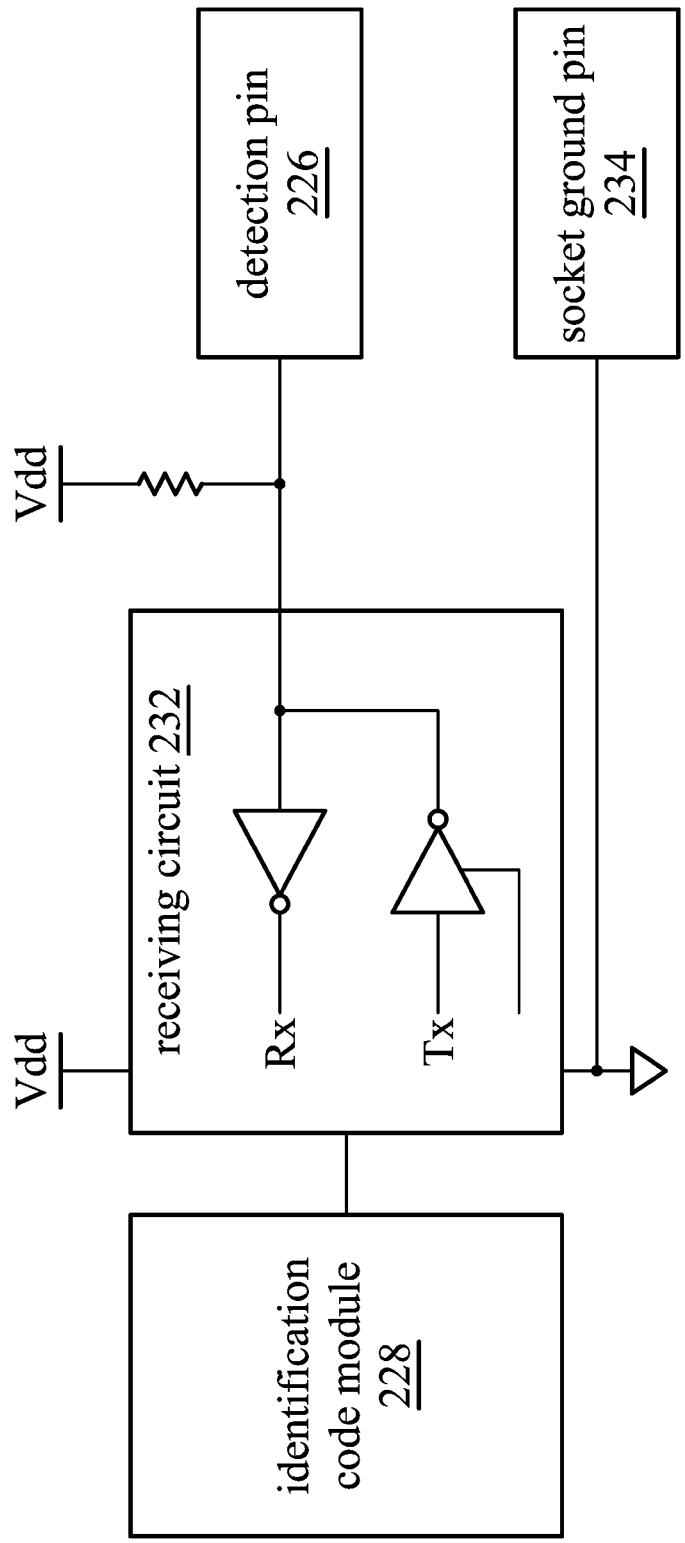
Figure 2E:
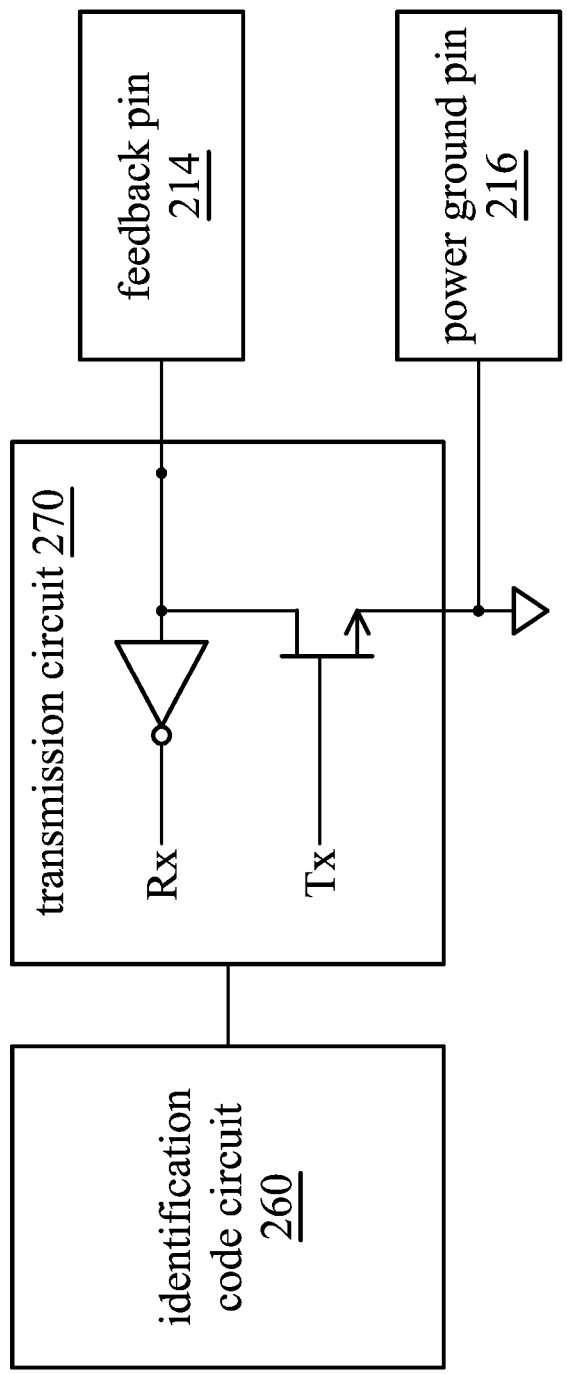

The following discusses the transmission principle of the identification code of the present disclosure in accordance with FIGS. 2C, 2D, and 2E. As shown in these Figs, the set of feedback pins 214 and the power ground pin 216 of the smart plug 210 are respectively connected to the detection pins 226 and the socket ground pin 234 of the smart socket 220. Then, the transmission circuit 270 is triggered by a direct current from the receiving circuit 232, and "actively" transmits the 64-bit identification code generated by the identification code circuit 260 (for example, a ROM) to the receiving circuit 232 via the circuit which is formed due to the connection between the smart socket 220 and smart plug 210. After the transmission, the identification code module 228 checks the identification code, and the network module outputs the identification code.

The generation of the identification code in this embodiment is different from that in the previous embodiment since the smart plug 210 in this embodiment is trigged by a direct current and "actively" sends the detection signal. Note that these embodiments are described for illustration purposes only. Those skilled in the art can appropriately modify and arrange the components in these embodiments of the present disclosure.

Smart Adaptor

Figure 3:
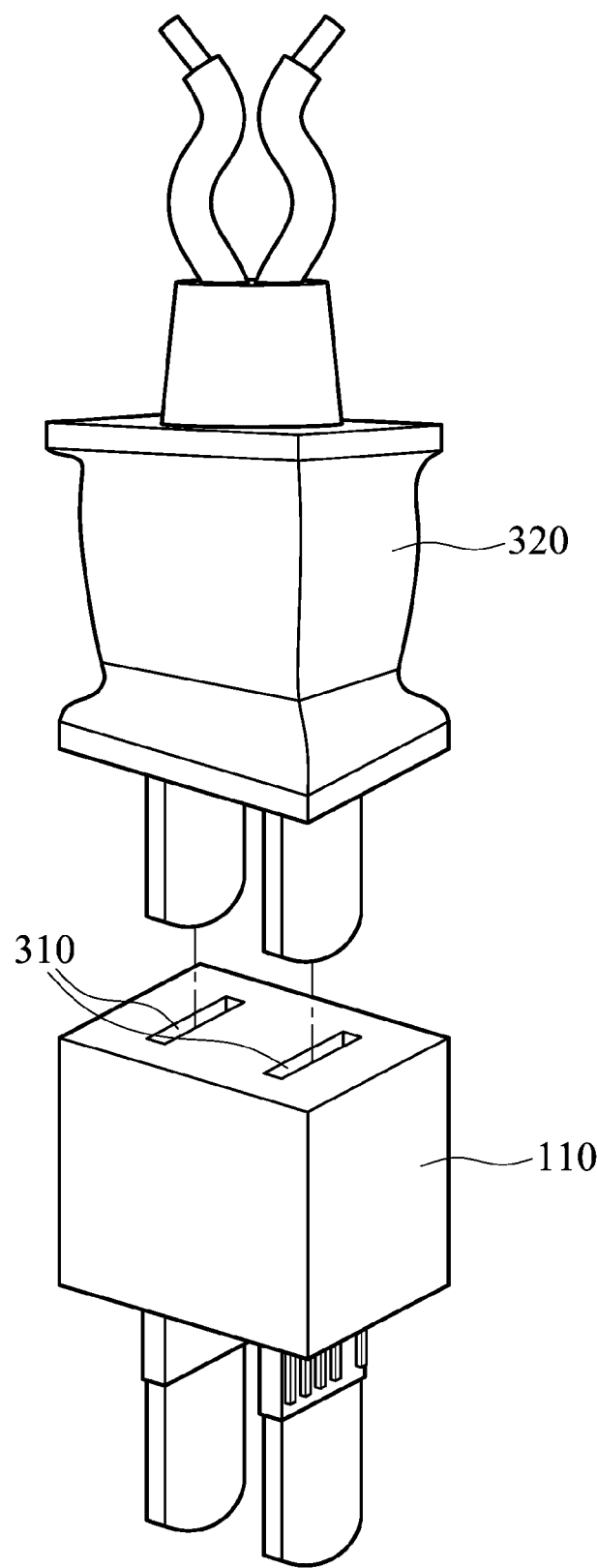
FIG. 3 shows a smart adaptor of the present disclosure.
Figure 4:
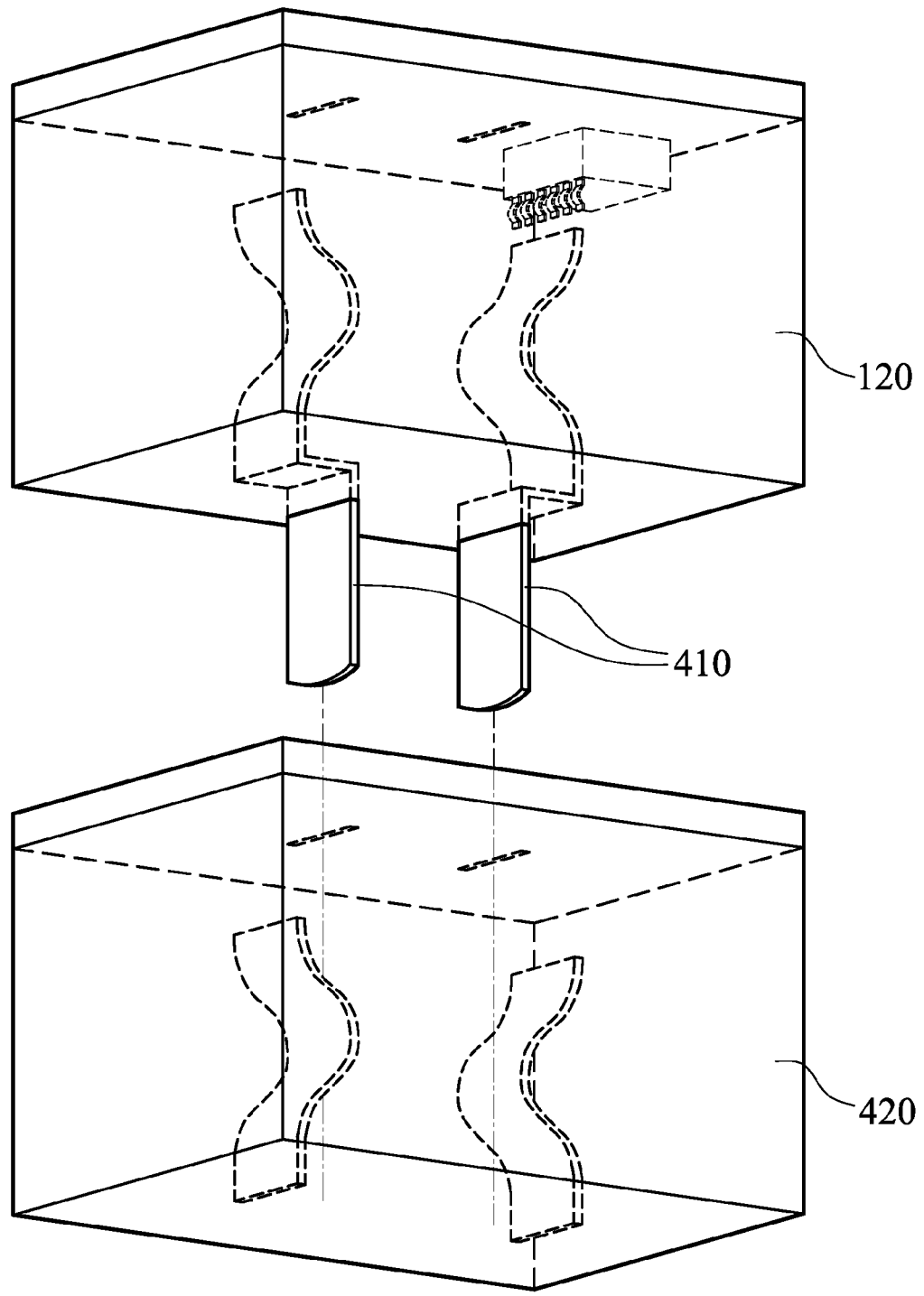
FIG. 4 shows another smart adaptor of the present disclosure.

The smart plugs and smart sockets of the present disclosure have been described in detail in previous embodiment. To adapt to traditional power plugs and sockets, the present disclosure further provide smart adaptors for the smart plugs and sockets previously described. The smart adaptor for the plugs is shown in FIG. 3, where the wire 116 of the smart plug 110 in FIG. 1A is replaced by an adapting socket 310. The adapting socket 310 can be used for connecting the normal plug 320 and further to an electric appliance of the normal plug 320 (not shown). The smart adaptor for the sockets is shown in FIG. 4, where the socket pins 124 of the smart socket 120 in FIG. 1B is extended from the case as adapting pins 410 for plugging into a normal socket 420 and therefore electrically connecting to a power source (not shown).

Figure 5:
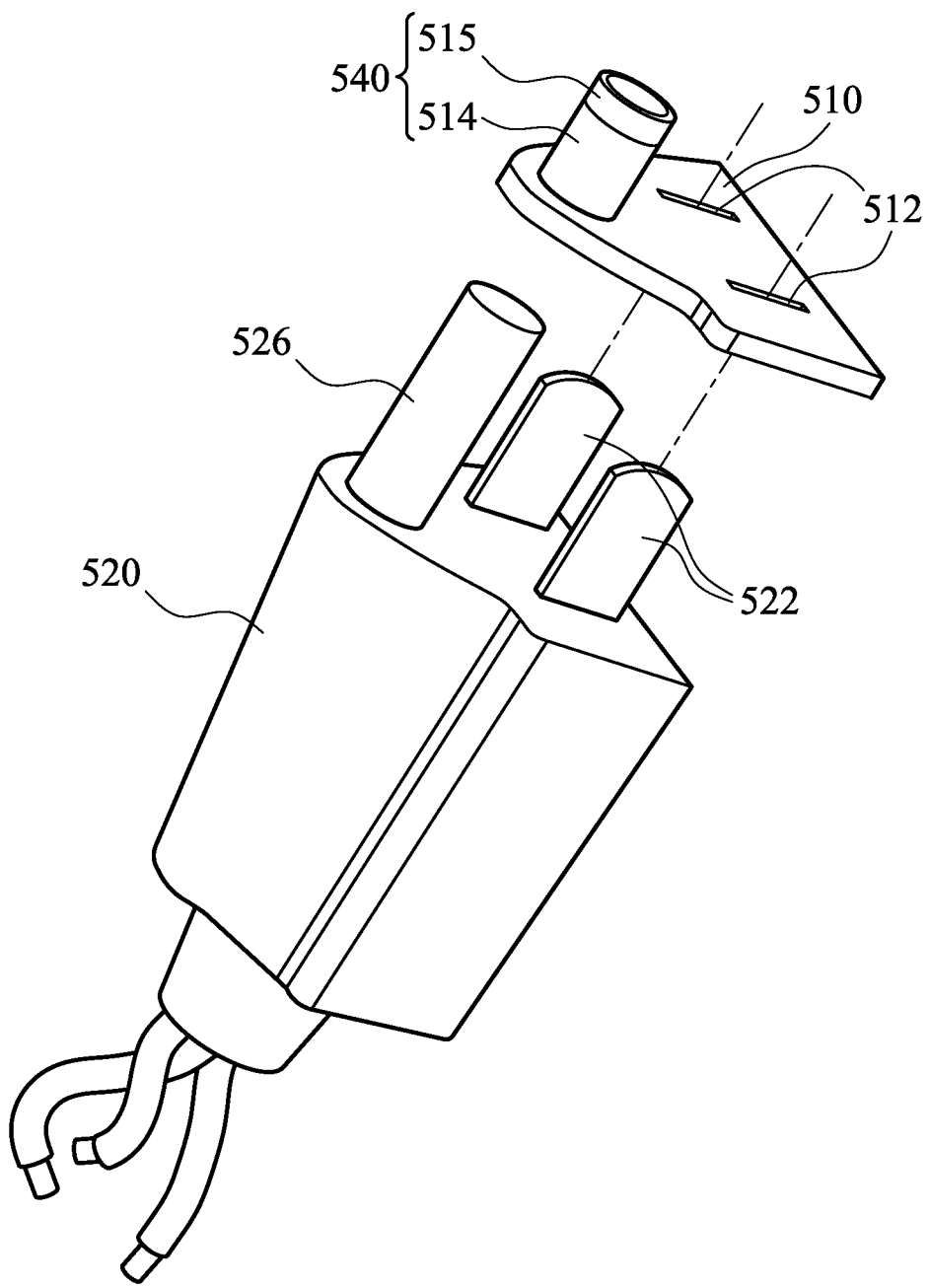
FIG. 5 shows another smart adaptor of the present disclosure.

The present disclosure further provides another smart adaptor in NEMA 1-15 B style. As shown in FIG. 5, the smart adaptor 510 is basically equal to the smart plug 210 in FIG. 2A shaped in sheet without the wire, the power pins 212 and the power ground pin 216. The smart adaptor 510 has an identification code circuit, the transmission circuit, and a metal cylinder 540 including a feedback pin 514 and insulation layer 515. The adapting socket 512 and the metal cylinder 540 are used for a smart socket to connect with the power pins 522 and the power ground pin 526 of the normal plug 520.

Network Module

The network modules in previous embodiments (for example, the network module 130 in FIG. 1B) can further send the identification code of the electric appliance to the network or information processing equipment such as digital electric meters, computers, or power source switches. With the smart plugs and smart sockets of the present disclosure, one can easily monitor power consumption of electric appliances when the related network modules are connected to the digital electric meters. Therefore, the present disclosure is advantageous in power monitoring which usually encourages further power saving. In addition, the present disclosure can help housekeepers to manage their household electric appliances by monitoring the electric appliances with the identification codes and determining whether they consume power abnormally. From a power safety aspect, the power sockets are usually a risk factor, especially for children. In some embodiments, there may be a power source switch disposed in the smart socket of the present disclosure for immediately turning the power off when an unexpected object is inserted to a power socket. Similarly, a mechanism could be derived to turn the power on only when an expected plug is inserted to the power socket.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus, comprising:
   a smart plug, comprising a set of power pins and a set of feedback pins, wherein the feedback pins are arranged so as to be insulated from the power pins; and
   a smart socket, comprising:
      a set of power sockets, configured for the set of power pins of the smart plug to plug into;
      a driving pin and a set of detection pins, configured to forming a circuit with the set of feedback pins of the smart plug when the set of power pins is plugged into the power sockets; and
      an identification code module, configured for obtaining from the circuit an identification code of an electric appliance to which the smart plug belongs.

2. The smart socket as claimed in claim 1, further comprising at least two socket pins, wherein the power pins electrically connect to a power source via the at least two socket pins.

3. The smart socket as claimed in claim 1, further comprising an adapting pin which electrically connects to a power source through plugging into a normal socket.

4. The smart socket as claimed in claim 1, further comprising a network module for transmitting the identification code to a network.

5. The smart socket as claimed in claim 2, further comprising a safety switch for controlling the connection between the socket pins and the power source, wherein the safety switch is turned on or off corresponding to the identification code.

6. A smart plug, comprising:
   a set of power pins, for plugging into a set of power sockets of a smart socket; and
   a set of feedback pins, configured for forming a circuit with a driving pin and a set of detection pins of a smart socket when the set of power pins and the set of power sockets are connected to each other, wherein the feedback pins are insulated from the power pins by an insulation layer lying over the power pins.

7. The smart plug as claimed in claim 6, wherein the power pins are electrically connected to an electric appliance.

8. The smart plug as claimed in claim 6, further comprising an adapting socket, configured for a normal plug of an electric appliance to plug into.

9. The smart plug as claimed in claim 6, further comprises an identification code circuit for generating an identification code.

10. The smart plug as claimed in claim 9, further comprising a transmission circuit, which is coupled to the identification code circuit, for actively transmitting the identification code to the identification code module when the set of power pins and the set of power sockets are connected to each other.

11. A smart adaptor, comprising:
    a set of adapting sockets, configured for a set of power pins of a normal plug to plug into, and for adapting the normal plug a smart socket;
    a set of adaptor power pins, for plugging into a set of power sockets of the smart socket; and
    a set of feedback pins, configured for forming a circuit with a driving pin and a set of detection pins of the smart socket when the adaptor power pins and the power sockets are connected to each other, wherein the feedback pins are insulated from the adaptor power pins by an insulation layer lying over the adaptor power pins.

12. The smart adaptor as claimed in claim 11, further comprising an identification code circuit for generating an identification code.

13. The smart adaptor as claimed in claim 11, further comprising a transmission circuit, which is coupled to the identification code circuit, for transmitting the identification code to the identification code module when the power pins and the power sockets are connected to each other.

14. The smart socket as claimed in claim 1, wherein when an unexpected object is inserted to the set of power sockets, a power source switch turns off power such that the unexpected object does not receive the power.

15. The smart socket as claimed in claim 1, wherein when an expected plug is inserted to the set of power sockets, a mechanism is derived to turn power on such that the expected plug receives the power.

\* \* \* \* \*